(12) United States Patent
Watanabe et al.

(10) Patent No.: US 8,537,503 B2
(45) Date of Patent: Sep. 17, 2013

(54) CPP STRUCTURE MAGNETORESISTIVE HEAD

(75) Inventors: Katsuro Watanabe, Ibaraki-Ken (JP); Shigeo Fujita, Kanagawa (JP); Norihiro Ookawa, Kanagawa (JP); Kenichi Meguro, Kanagawa (JP)

(73) Assignee: HGST Netherlands B.V., Amsterdam (NL)

( * ) Notice: Subject to any disclaimer, the term of this patent is extended or adjusted under 35 U.S.C. 154(b) by 980 days.

(21) Appl. No.: 12/547,394

(22) Filed: Aug. 25, 2009

(65) Prior Publication Data
US 2010/0053821 A1 Mar. 4, 2010

(30) Foreign Application Priority Data
Aug. 26, 2008 (JP) ................................. 2008-216634

(51) Int. Cl.
*G11B 5/33* (2006.01)
(52) U.S. Cl.
USPC .................................................... 360/324.11
(58) Field of Classification Search
None
See application file for complete search history.

(56) References Cited

U.S. PATENT DOCUMENTS

| 7,088,560 | B2 | 8/2006 | Kudo et al. |
| 7,243,412 | B2 | 7/2007 | Furukawa et al. |
| 7,274,542 | B2 * | 9/2007 | Shintani et al. ............ 360/324.1 |
| 7,327,539 | B2 | 2/2008 | Saito |
| 7,609,490 | B2 * | 10/2009 | Mizuno et al. ........... 360/324.11 |
| 2005/0254179 | A1 * | 11/2005 | Miyauchi et al. .......... 360/324.1 |
| 2007/0019341 | A1 * | 1/2007 | Mizuno et al. ........... 360/324.11 |

FOREIGN PATENT DOCUMENTS

| JP | 2002-151756 | 5/2002 |
| JP | 2004-005763 | 1/2004 |
| JP | 2004-335071 | 11/2004 |
| JP | 2005-086061 | 3/2005 |
| JP | 2008-216634 | 9/2008 |

* cited by examiner

*Primary Examiner* — David D Davis
(74) *Attorney, Agent, or Firm* — Zilka-Kotab, PC

(57) ABSTRACT

According to one embodiment, a magnetoresistive head has a magnetoresistive sensor film between a lower shield layer and an upper shield layer. The magnetoresistive sensor film is formed by stacking at least a pinning layer, a first ferromagnetic layer, an intermediate layer, and a second ferromagnetic layer, in which a sense current flows so as to pass through an interface between the intermediate layer and the second ferromagnetic layer, and a resistance change of the magnetoresistive sensor film in accordance with the change of an external magnetic field is detected. Also, a lateral side metal layer having an electric resistivity lower than the electric resistivity of the pinning layer is disposed at least on a side wall of the pinning layer among side walls of layers constituting the magnetoresistive sensor film, the lateral side metal layer being in contact with the lower shield layer. Other embodiments are described as well.

20 Claims, 12 Drawing Sheets

CPP STRUCTURE MAGNETORESISTIVE HEAD

RELATED APPLICATIONS

The present application claims the priority of a Japanese Patent Application filed Aug. 26, 2008 under Appl. No. 2008-216634, which is incorporated herein by reference.

FIELD OF THE INVENTION

The present invention relates to a magnetoresistive head of a CPP (current perpendicular to plane) structure in which a sense current flows so as to pass through a stacked plane of a magnetoresistive sensor film.

BACKGROUND OF THE INVENTION

A magnetoresistive sensor utilizing the magnetoresistive effect in which electric resistance changes depending on the change of an external magnetic field has been known as an excellent magnetic field sensor and has been put to practical use as a read element of a magnetic head which is an important part for magnetic recording and reproducing apparatus. Since size-reduction has been progressed in the magnetic storage apparatus, improvement of the performance has also been desired for a magnetic head that reads and writes information. Among them, a main objective of improving the read element includes higher areal density and higher output.

For higher recording density, narrowing of the track width and improvement of the read resolution are necessary. The track width can be narrower by narrowing a physical width, in a track width direction, of a magnetoresistive sensor film that converts a signal magnetic field generated from a magnetic recording medium into an electric signal. For this end, pattern-forming techniques including photolithography have been developed and improved.

On the other hand, the read resolution can be improved by narrowing the gap (read gap length) between two shield layers, i.e., an upper shield layer and a lower shield layer which are disposed above and below a magnetoresistive sensor film. Upon narrowing the read gap length, it is also necessary to consider the structure of the read head. In a read head of a CIP (current into plane) structure which flows a sense current in the in-plane direction of a magnetoresistive sensor film, for example, an anisotropic magnetoresistive effect (AMR) head or a giant magnetoresistive (GMR) head, insulating layers are required between a magnetoresistive sensor film and upper shield layer, and between a magnetoresistive sensor film and lower shield layer respectively so as not to leak the sense current to the shield layer and lower the output. Therefore, reducing the read gap length to about 50 nm or less is difficult. To attain the read gap length to less than that described above, a CPP (current perpendicular to plane) structure is more advantageous, in which upper and lower shield layers are used as a portion of an electrode, and a sense current flows in a direction perpendicular to the film plane of a magnetoresistive sensor film disposed between the upper and lower shield layers. The CPP structure magnetoresistive head includes, for example, a tunneling magnetoresistive effect (TMR) head and a CPP-GMR head.

However, it has been found that the CPP structure magnetoresistive head involves a problem of less dissipating heat since a portion of the magnetoresistive sensor film more tends to generate heat than the CIP structure magnetoresistive head and, in addition, the heat conduction of the shield layer is not so high as expected so far according to the inventor's study. In the CIP structure head, since the sense current flows in the in-plane direction of the stacked plane of the magnetoresistive sensor film, more sense current flows to a layer comprising a material with lower electric resistivity in the layers constituting the magnetoresistive sensor film, thus decreasing a sense current flowing to a material with high electric resistivity. Generally, the material of low electric resistivity described above is Copper provided between two ferromagnetic layers which are an important part for generating the magnetoresistive effect, and the fact that a large sense current flows in this layer means that a high output is generated. Further, a material having a high electric resistivity is a pinning layer, that is, an antiferromagnetic material or a permanent magnetic material, and decrease in the sense current flowing therethrough means that heat generation is also suppressed.

Furthermore, in the CPP structure magnetoresistive head, since the sense current flows so as to pass through the stacked plane of the magnetoresistive sensor film, an identical current flows basically to any of the layers. That is, when a large sense current flows in an intermediate layer provided between two ferromagnetic layers as an important part that generates the magnetoresistive effect, an identical current flows also to the pinning layer of high electric resistivity to result in large heat generation. In the case of a metal, since the electric resistivity increases along with temperature rise and the resistance of the read element of the CPP structure magnetoresistive head increases by the heat generation, this causes read performance deterioration such as lowering of the output or increase in resistive noises (Johnson noises). Further, since insulative films are disposed on both sides and in a stripe height direction of the magnetoresistive sensor film, which is a heat generation source, so that the sense current flows to the magnetoresistive sensor film, the heat dissipation efficiency is also poor. Such large heat generation and poor heat dissipation may result in a possibility of deteriorating a-long-time-reliability, for example, a current load lifetime.

Japanese Patent Office (JPO) Pub. Nos. JP-A-2002-151756, JP-A-2004-5763, and JP-A-2004-335071 disclose a structure of suppressing the heat generation and improving the heat dissipation efficiency of a CPP structure magnetoresistive head.

While JPO Pub. No. JP-A-2002-151756 discloses a structure in which a hard magnetic layer is adjacent to each side of a CPP stacked structural portion, it states that the hard magnetic layer in this case is a high resistance material. According to the Wiedmann-Franz law, since a material of high electric resistivity, that is, low electric conductivity also has low heat conductivity, heat dissipation efficiency is not improved.

Further, while JPO Pub. No. JP-A-2004-5763 discloses a structure of disposing a heat dissipation layer at the back in the stripe height direction of a GMR film, the heat dissipation layer is disposed through an insulating layer. Considering that the insulating layer should have such a thickness as capable of electrically insulating the GMR film and the heat dissipation layer and that the heat conductivity of the insulation material is lower compared with that of a metal, a significant advantage may not be expected even if the heat dissipation effect may be improved.

Further JPO Pub. No. JP-A-2004-335071 discloses a structure of disposing an antiferromagnetic layer of high electric resistivity so as to be in contact with the lateral side in the track width direction of the lateral side in the stripe height direction of the pinned magnetic layer and not disposing the antiferromagnetic layer in a main path of the sense current. In this structure, a sense current shunts only slightly in the anti ferromagnetic layer of high electric resistivity, and the anti ferromagnetic layer per se may generate less heat. However, since the antiferromagnetic layer is in contact with the pinned magnetic layer only on the lateral side, this structure has a less effect of pinning the magnetization of a pinned magnetic layer. Further, since the lateral side of the pinned magnetic layer is formed by an etching process, crystals of the pinned magnetic layer are damaged and/or the surface is oxidized, resulting in difficulty obtaining a sufficient magnetic coupling to pin the magnetization of the pinned magnetic layer.

SUMMARY OF THE INVENTION

In a CPP structure magnetoresistive head, heat generation of the magnetoresistive sensor film is suppressed, heat dissipation is improved, and higher SNR is attained without deteriorating the exchange coupling properties between a pinning layer and a pinned ferromagnetic layer, according to one embodiment.

In a magnetoresistive head of a CPP structure, according to one approach, in which a magnetoresistive sensor film having at least a pinning layer is disposed between a lower shield layer and an upper shield layer, a lateral side metal layer comprising a material having an electric resistivity lower than the electric resistivity of a material constituting the pinning layer is disposed at least on the side wall of the pinning layer constituting the magnetoresistive sensor film, and further, the lateral side metal layer is disposed along the side wall of the magnetoresistive sensor film so as to be in contact with the lower shield layer.

In another embodiment, a magnetoresistive head has a magnetoresistive sensor film between a lower shield layer and an upper shield layer. The magnetoresistive sensor film is formed by stacking at least a pinning layer, a first ferromagnetic layer, an intermediate layer, and a second ferromagnetic layer, in which a sense current flows so as to pass through an interface between the intermediate layer and the second ferromagnetic layer, and a resistance change of the magnetoresistive sensor film in accordance with the change of an external magnetic filed is detected. Also, a lateral side metal layer having an electric resistivity lower than the electric resistivity of the pinning layer is disposed at least on a side wall of the pinning layer among side walls of layers constituting the magnetoresistive sensor film in a track width direction, the lateral side metal layer being in contact with the lower shield layer.

In another embodiment, a magnetoresistive head has a magnetoresistive sensor film between a lower shield layer and an upper shield layer. The magnetoresistive sensor film is formed by stacking at least a pinning layer, a first ferromagnetic layer, an intermediate layer, and a second ferromagnetic layer, in which a sense current flows so as to pass through an interface between the intermediate layer and the second ferromagnetic layer, and a resistance change of the magnetoresistive sensor film generated by the change of an external magnetic field is detected. Also, a lateral side metal layer having an electric resistivity lower than the electric resistivity of the pinning layer is disposed at least on a side wall of the pinning layer among side walls of layers constituting the magnetoresistive sensor film in a stripe height direction, the lateral side metal layer being in contact with the lower shield layer.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

DETAILED DESCRIPTION

Figure 1:
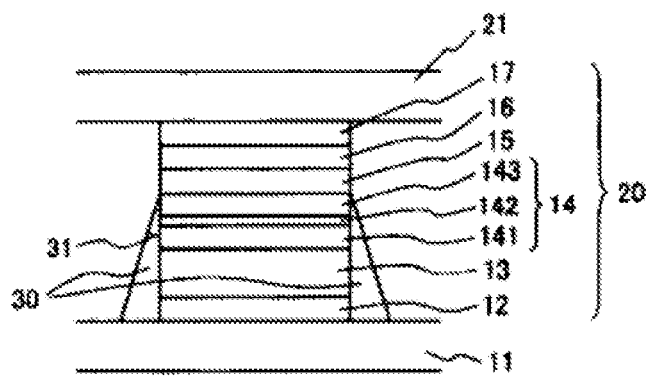
FIG. 1 is a schematic structural view in a track width direction showing a basic constitution of a CPP structure magnetoresistive head according to the invention.

An object of the invention, according to one embodiment, is to provide a CPP structure magnetoresistive head capable of suppressing heat generation in a magnetoresistive sensor film and having a favorable heat dissipation efficiency without deteriorating exchange coupling properties between a pinning layer and a pinned ferromagnetic layer.

The foregoing object can be attained by providing a magnetoresistive head described below, according to one embodiment. The magnetoresistive head has a magnetoresistive sensor film which is formed between a lower shield layer and an upper shield layer by stacking at least a pinning layer, a first ferromagnetic layer, an intermediate layer, and a second ferromagnetic layer. The electric resistivity of the material constituting the pinning layer is higher than the electric resistivity of the material constituting the first ferromagnetic layer. A resistance change of the magnetoresistive sensor film in accordance with the change of an external magnetic field is detected by flowing a sense current so as to pass through an interface between the intermediate layer and the second ferromagnetic layer. In the magnetoresistive head, a lateral side metal layer having an electric resistivity lower than the electric resistivity of the pinning layer is disposed at least on a side wall of the pinning layer among side walls of layers constituting the magnetoresistive sensor film. The lateral side metal layer is disposed along the side wall of the magnetoresistive sensor film so as to be in contact with the lower shield layer.

In this case, the side wall of the magnetoresistive sensor film on which the lateral side metal layer is disposed may be a side wall in the track width direction, a side wall in the stripe height direction, or all of the side walls described above.

Further, preferably the lower end of the lateral side metal layer may be in contact with the lower shield layer as described above and the upper end thereof is not in contact with the side wall of the intermediate layer. Preferably, the material for the lateral side metal layer may comprise a material selected from the group consisting of: Cu, Rh. Co—Fe alloy, Ru, Cr, and an alloy of any of these materials.

Further, while the intermediate layer may be a tunnel barrier layer, a material thereof may be a conductive material, and/or a mixture of a conductive material and a high resistance material or an insulative material. A higher advantage is obtained in the latter.

According to one embodiment, heat generation may be suppressed and heat dissipation efficiency may be improved for the magnetoresistive sensor film of the CPP structure magnetoresistive head, without deteriorating the exchange coupling properties between the pinning layer and the pinned ferromagnetic layer.

To ensure the long time reliability of a CPP structure magnetoresistive head, suppression of heat generation as much as possible is desired, and for this purpose, the amount of the heat generation in each of the layers of the magnetoresistive sensor film was estimated.

The result of analysis for a CPP-GMR sensor film is described below as an example. The CPP-GMR film subjected to the analysis includes (all dimensions are approximate) a seed layer of 5 nm thick Ta, 2 nm thick 81 at. %-Ni-19 at. %-Fe (hereinafter referred to as $Ni_{81}Fe_{19}$), antiferromagnetic layer (pinning layer) of 15 nm thick Pt—Mn antiferromagnetic material, first ferromagnetic layer (pinned layer) of 3 nm thick $Co_{90}OFe_{10}$/0.8 nm thick Ru/3 nm thick $Co_{50}Fe_{50}$, intermediate layer of 3 nm thick Cu, second ferromagnetic layer (free layer) of 1 nm thick $Co_{50}Fe_{50}$/0.25 nm thick Cu/1 nm thick $Co_{50}Fe_{50}$/0.25 nm thick Cu/1 nm thick $Co_{50}Fe_{50}$, cap layer of 2 nm thick Cu/1 nm thick Ta, from the side of the lower electrode layer successively, and the device dimension is about 50 nm for the track width and about 50 nm for the stripe height. Further, the sense current is supplied uniformly from electrodes disposed above and below the CPP-GMR film as the magnetoresistive sensor film to the CPP-GMR film. The magnetoresistive head is driven at a constant voltage of 100 mV, and the sense current I is defined as a value obtained by dividing 100 in V with the electric resistance value of the CPP-GMR film having the structure and the dimensions described above. The resistance value Ri for each of the layers constituting the CPP-GMR film is determined experimentally and the Joule heat generation power Pi in each of the layers is estimated according to the following Equation (1).

$$Pi = I^2 \times Ri \quad (1)$$

Figure 2:
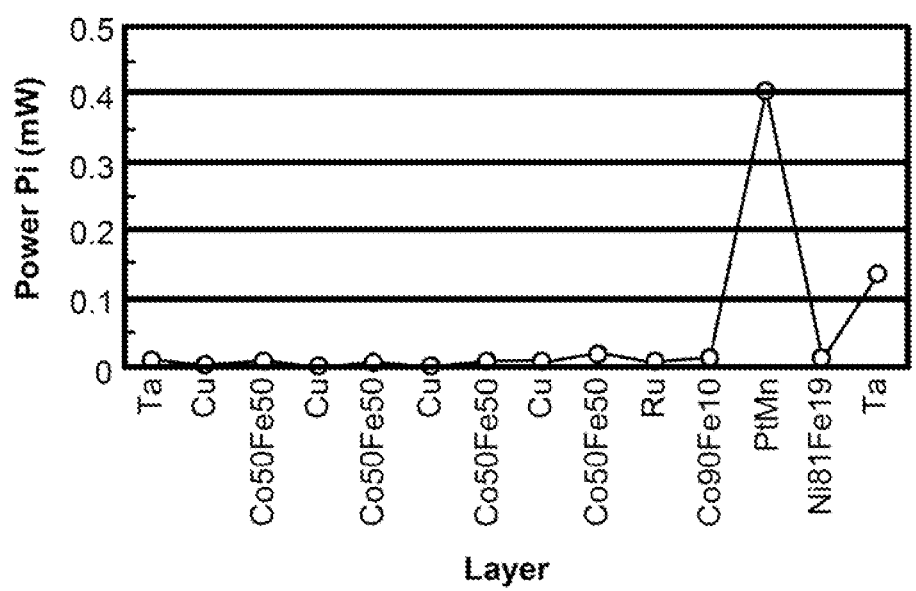
FIG. 2 is a graph showing the result of analysis of Joule heat generation power in each of the layers of a CPP-GMR film.

The result is shown in FIG. 2. In FIG. 2, the abscissa shows each of the layers comprising the CPP-GMR sensor film in which the right side of the abscissa corresponds to the side of the lower shield layer and the left side thereof corresponds to the side of the upper shield layer. The ordinate shows the Joule heat generation power in each of the layers. FIG. 2 shows the results that the heat generation amount is as low as 0.02 mW or less in each of the layers except for Ta of the seed layer and Pt—Mn antiferromagnetic material of the antiferromagnetic layer, and the heat generation is about 0.13 mW for Ta of the seed layer and, further, the heat generation increases as high as to 0.40 mW for the Pt—Mn antiferromagnetic material of the antiferromagnetic layer. The analysis shows that suppression of heat generation in the antiferromagnetic layer or improving of the heat dissipation efficiency relative to the heat generation is important in order to suppress the heat generation in the magnetoresistive sensor film. The analysis is performed assuming that the device dimension is 50 nm for the track width and 50 nm for the stripe height. However, even when the device dimensions change, the relative relation between the heat generation power does not change although the absolute value of the Joule heat generation power Pi changes.

Then, the reason why the heat generation is large in the anti ferromagnetic layer is to be considered. The electric resistance R is given by the following Equation (2) assuming the electric resistivity as ρ, the cross sectional area for the current passing path as A, and the length thereof as L:

$$R = \rho \times L/A \quad (2)$$

Since the antiferromagnetic layer may comprise a manganese-containing metal material or oxide, the electric resistivity ρ is higher compared with that of other layers. Further, the antiferromagnetic layer serves to pin the magnetization direction for the first ferromagnetic layer to a desired direction even in a state where a stray magnetic field from a magnetic recording medium disposed in a magnetic storage apparatus or a magnetic field from the outside generated, for example, from a motor or the like is ineffective. For this purpose, while a self-energy of overcoming the disturbance magnetic field described above is required, since the track width or the stripe height is restricted to a desired dimension, a large film thickness is necessary. Since the film thickness corresponds to L in Equation (2), its electric resistance increases.

As described above, the anti ferromagnetic layer shows large Joule heat generation power because of high electric resistivity ρ and large film thickness L compared with other layers. However, since the high electric resistivity and a large film thickness compared with other layers is necessary for a hard magnetic layer used for the pinning layer in addition to the antiferromagnetic layer, the hard magnetic layer shows the Joule heat generation power maximum among the magnetoresistive sensor film also in the case where the hard magnetic layer is used instead of the antiferromagnetic layer.

Further, even when the film structure and the film thickness put to analysis are changed, since the necessary condition for the pinning layer has been described above, while the relative relation of the heat generation amount is changed, the fact that the pinning layer is the maximum heat generation source remains unchanged.

Further, in the case where the intermediate layer is a thick tunnel barrier layer, since the tunnel barrier layer is thick, the sense current is a tunnel current passing through the tunnel barrier layer, and the absolute value thereof is small, the module heat generation power of the pinning-layer is not predominant. However, along with increase of the areal density and the transfer rate of the magnetic storage apparatus, since defining of the area resistance RA of the TMR (tunneling magnetoresistive) film (product of electric resistance value R and the area A for the sense current passing path) to about 1 $\Omega*\mu m^2$ or less, it is also necessary to reduce the thickness of the tunnel barrier layer. In this case, since the tunnel barrier layer is thin, the resistance of the tunnel barrier layer is lowered and, in addition, the sense current increases by constant voltage driving the heat generation amount in the pinning layer is greater than the heat generation amount of the tunneling barrier layer to become maximum among the magnetoresistive sensor film.

Next, description is made of a method of suppressing the heat generation in the pinning layer in a CPP-GMR sensor film and a low resistance TMR sensor film, the method being revealed by the analysis. According to Equation (1), since the Joule heat generation power Pi is given by the sense current I and the resistance value Ri of each of the layers, Pi can be decreased by decreasing these values. However, since the change of Ri means the change of the material or the film thickness of the layer, this changes also the magnetoresistive ratio, that is, read output. Therefore, a structure to decrease Pi by, changing the sense current I is considered.

FIG. 1 shows an example of such a basic constitution, and is a schematic structural view of a magnetoresistive sensor, according to one embodiment. A CPP-GMR film 20 including a seed layer 12, a pinning layer 13, a first ferromagnetic layer 14, an intermediate layer 15, a second ferromagnetic layer 16, and a cap layer 17 is disposed between a lower shield layer (lower electrode layer) 11 and an upper shield layer (upper electrode layer) 21, and a lateral side metal layer 30 is disposed on both sides thereof. The track width and the stripe height of the CPP-GMR film 20 before disposing the lateral side metal layer 30 are constant with respect to the direction of the film thickness of the CPP-GMR film 20. In this case, the lateral side metal layer 30 is in contact at its upper end with an interface between the first ferromagnetic layer 14 and the intermediate layer 15 and at its lower end with the lower shield layer 11, and is gradually widened from the upper end to the lower end at a taper angle 31. The taper angle 31 may be defined as a difference between an average angle for the wall surface of the CPP-GMR film 20 and an average angle for the outer slope of the lateral side metal layer 30. In this structure, a predetermined sense current passes through two interfaces that generate the magnetoresistive effect, that is, an interface between the intermediate layer 15 and the second ferromagnetic layer 16. However, since a parallel circuit composed of each of the layers constituting the CPP-GMR film 20 and the lateral side metal layer 30 disposed on both sides of the CPP-CMR film 20 is formed in a region from the first ferromagnetic layer 14 to the lower shield layer 11, the sense current is shunted into the CPP-GMR film 20 and the lateral side metal layers 30. As described above, since the sense current flows with no shunt at the two interfaces that generate the magnetoresistive effect, the output is not lowered. Furthermore, since the sense current flowing to the layers constituting the CPP-GMR film 20 decreases from the first ferromagnetic layer 14 to the lower shield layer (lower electrode layer) 11, the Joule heat generation power, particularly in the pinning layer 13, is decreased compared with that in the conventional structure.

Figure 3:
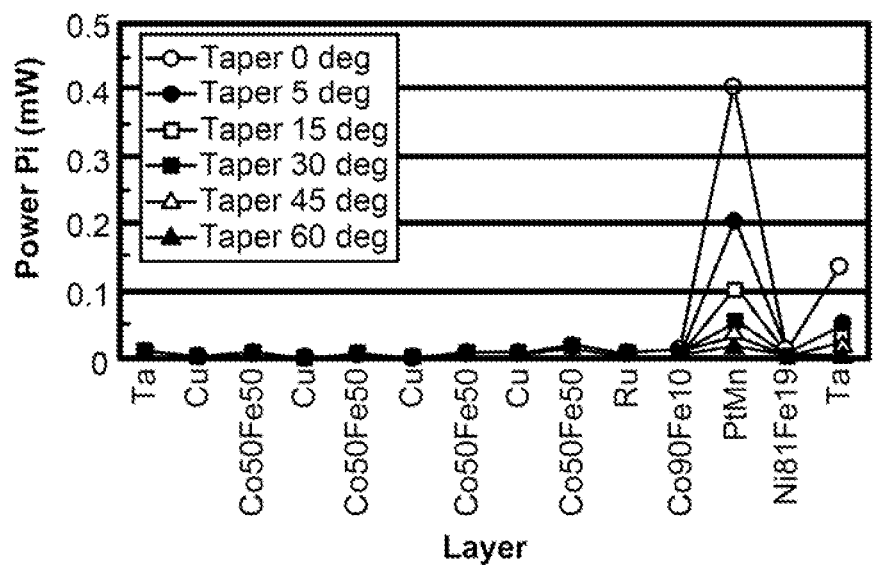
FIG. 3 is a graph showing the result of analysis of Joule heat generation power in each of the layers of the CPP-GMR film in the case where the taper angle of a lateral side metal layer of the CPP structure magnetoresistive head shown in FIG. 1 is changed.

FIG. 3 shows the result of analyzing the effect. The constitution of the CPP-GMR film used for the analysis is identical with the constitution used for the analysis in FIG. 2 and Cu is used as the lateral side metal layer 30. The taper angle 31 (represented as Taper in the graph) is changed from 0° to 60°. Since the taper angle 0° corresponds to a case of not disposing the lateral side metal layer 30, the constitution is identical with that used for the analysis in FIG. 2. However, by providing the lateral side metal layer 30, the Joule heat generation power decreases on the side of the lower shield layer 11 than in the ferromagnetic layer on the side of the intermediate layer 143, the spacer layer 142, and the ferromagnetic layer on the side of the pinning layer 141, 143, 142, and 141 constituting the first ferromagnetic layer 14, the effect of disposing the lateral side metal layer 30 does not appear remarkable. However, the effect is conspicuous in the pinning layer 13 (Pt—Mn antiferromagnetic layer in this case and Ta of the seed layer 12, the seed layer 12 and the pinning layer 13 having high electric resistivity and large film thickness). Further, a higher effect developing is apparent by enlarging the taper angle.

Figure 4:
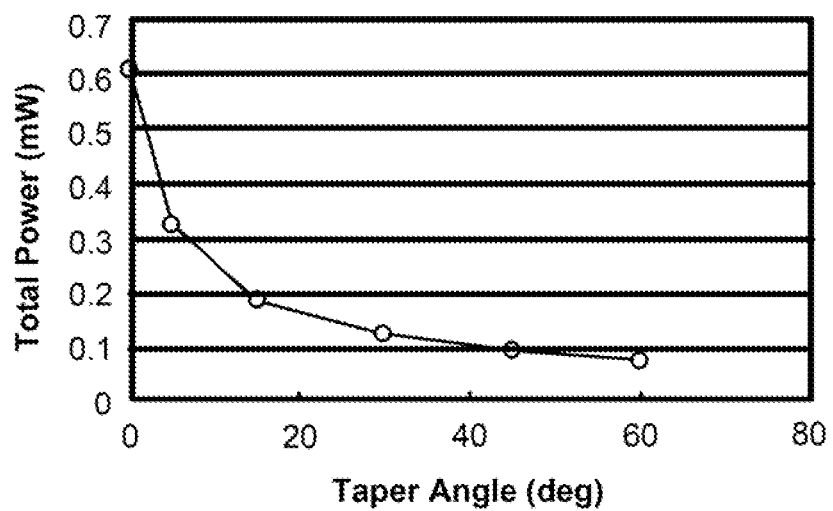
FIG. 4 is a graph showing Joule heat generation power of the entire CPP-GMR film in the case where the taper angle of the lateral side metal layer of the CPP structure magnetoresistive head shown in FIG. 1 is changed.

FIG. 4 is a graph formed by plotting the Joule heat generation power of the entire CPP-GMR film relative to the taper angle, and shows that the heat generation of 0.61 mW at the taper angle of 0° where the lateral side metal layer 30 is not disposed is decreased as low as to about one half this amount, that is, about 0.32 mW by disposing the lateral side metal layer 30 at the taper angle of 5°, and decreased to about 0.08 mW when it is disposed at the taper angle of 60°. As described above, while the heat generation amount is decreased by disposing the lateral side metal layer 30, since the lateral side metal layer 30 is extended as far as the lower shield layer 11, heat generated in the CPP-GMR film is dissipated through the lateral side metal layer 30 to the lower shield layer 11. Also, the lower shield layer 11 has a larger area compared with the magnetoresistive sensor film 20 and the heat dissipation efficiency is improved. Therefore, heat dissipation to the lower shield layer 11 through a wide heat dissipation path is an effective method. In this case, the effect of heat dissipation by the lateral side metal layer 30 is higher as the heat conductivity of the material is higher. According to the Wiedemann-Franz's law, since a material of low electric resistivity has high heat conductivity, the material having a high heat-generation-suppressing-effect also has a high heat-dissipation effect.

Figure 5:
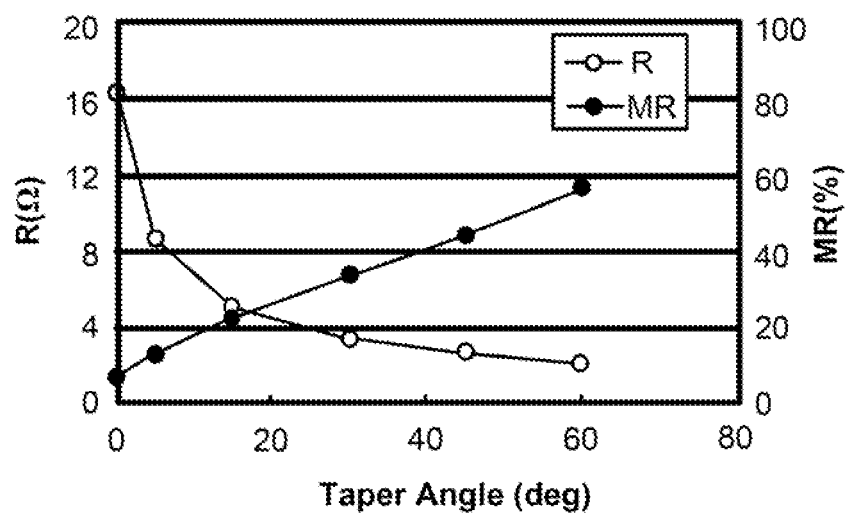
FIG. 5 is a graph showing a device resistance R and an MR ratio in the case where the taper angle of the lateral side metal layer of the CPP structure magnetoresistive head shown in FIG. 1 is changed.

Further, FIG. 5 shows a device resistance R and an MR ratio of the CPP-GMR film when the taper angle of the lateral side metal layer 30 is changed, according to one embodiment. R, which is at 16.4Ω in the case where the lateral side metal layer 30 is not provided, lowers to 8.7Ω when the lateral side metal layer 30 is provided at a taper angle of 5°, and R further lowers as the taper angle is made larger. On the other hand, since the magnetoresistive effect is not deteriorated, the MR ratio which is at 7% in the CPP-GMR film is improved by lowering of R. This means that an identical output is obtained with a low device resistance when sense current is identical. Since the sense current also increases by lowering of R in the constant voltage driving, the output also increases. As described above, since resistive noises (Johnson noises) are decreased and, further, the output is also improved by lowering of R, a high signal-to-noise ratio (SNR) can be obtained as a result.

Figure 6:
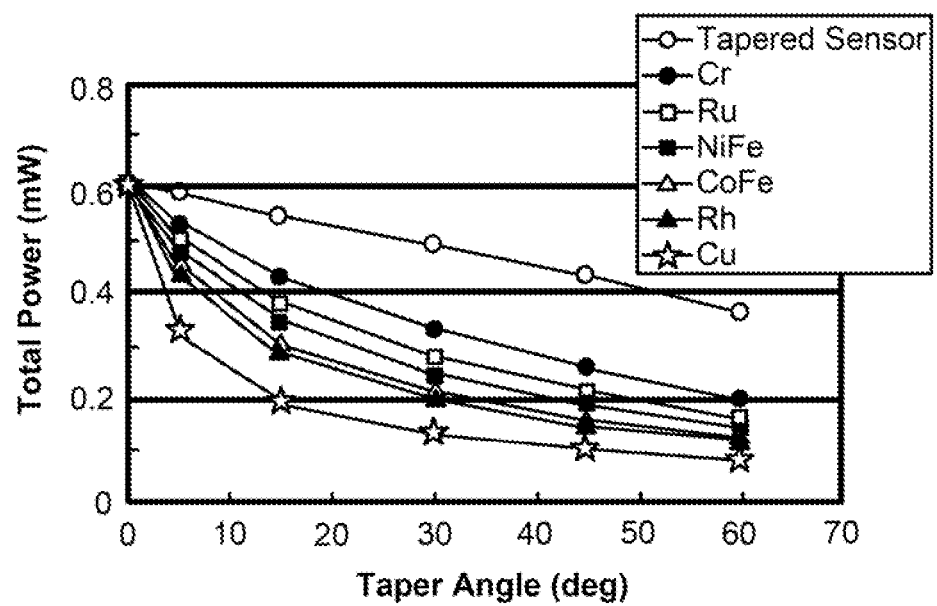
FIG. 6 is a graph showing Joule heat generation power of the entire CPP-GMR film in the case where materials of the lateral side metal layer of the CPP structure magnetoresistive head shown in FIG. 1 is changed.

While descriptions have been made specifically in the case where Cu is used as the material for the lateral side metal layer 30, similar analysis is also performed on other materials. FIG. 6 is a graph prepared by plotting the Joule heat generation power of the entire magnetoresistive sensor film when the taper angle of the lateral side metal layer 30 is changed, in the case where Cr, Ni—Fe alloy, Co—Fe alloy, Ru, and Rh as materials of the magnetoresistive head are used for the lateral side metal layer 30 in addition to Cu.

Further, FIG. 6 also plotted a case where the magnetoresistive sensor film is provided by being tapered from the first ferromagnetic layer 14 to the seed layer 12 without disposing the lateral side metal layer 30 (represented as sensor tapered in the graph). The graph shows that the heat generation amount is suppressed more in any case where the materials are used, compared with the case where the magnetoresistive sensor film is provided in a tapered shape. Further, the effect is higher as the electric resistivity is lower. In the order of higher effects, the compared materials are arranged as follows: Cu, Rh, Co—Fe alloy, Ni—Fe alloy, Ru, and Cr.

While the foregoing results show the analysis of the case where the pinning material is the Pt—Mn antiferromagnetic material, the same effects can be obtained in the case where other pinning materials, for example, an Mn—Ir antiferromagnetic material, a Co—Pt hard magnetic material, etc., are used. As an example, results of the analysis are shown below when the Mn—Ir antiferromagnetic material of about 10 nm thickness is used as the pinning layer 13 for the CPP-GMR film 20 described above. In this case, since the thickness of the pinning layer 13 is reduced to lower the device resistance, the sense current increases by constant voltage driving at 100 mV.

Figure 7:
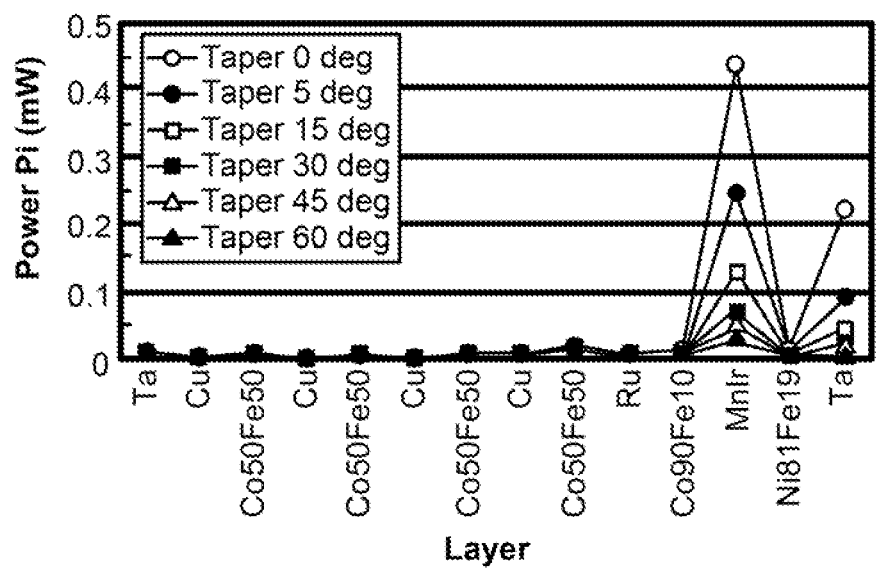
FIG. 7 is a graph showing the result of analysis of Joule heat generation power in each of the layers of the CPP-CMR film in the case where an Mn—Ir, antiferromagnetic material of a pinning layer is used and the taper angle of the lateral side metal layer is changed, in the CPP structure magnetoresistive head shown in FIG. 1.

FIG. 7 shows the Joule heat generation power in each of the layers by using Cu for the lateral side metal layer 30. While the basic trend that the heat generation amount is large in the pinning layer is not changed, the absolute value of the heat generation amount is increased since the sense current increases.

Figure 8:
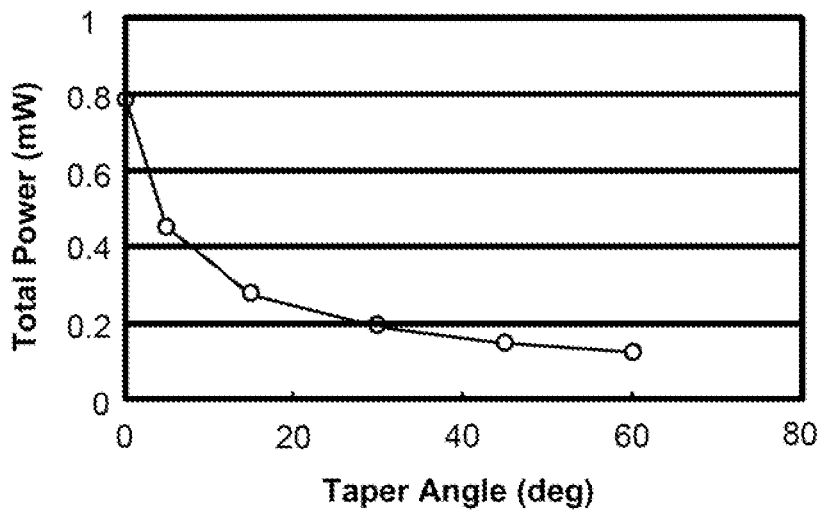
FIG. 8 is a graph showing Joule heat generation power of the entire CPP-GMR film in the case where the taper angle of the lateral side metal layer of the CPP-GMR film shown in FIG. 7 is changed.

FIG. 8 shows the Joule heat generation power of the entire magnetoresistive sensor film in this case, in which the Joule heat generation power is decreased by enlarging the taper angle, but the absolute value is increased more compared with that shown in FIG. 4 due to increase of the sense current.

Figure 9:
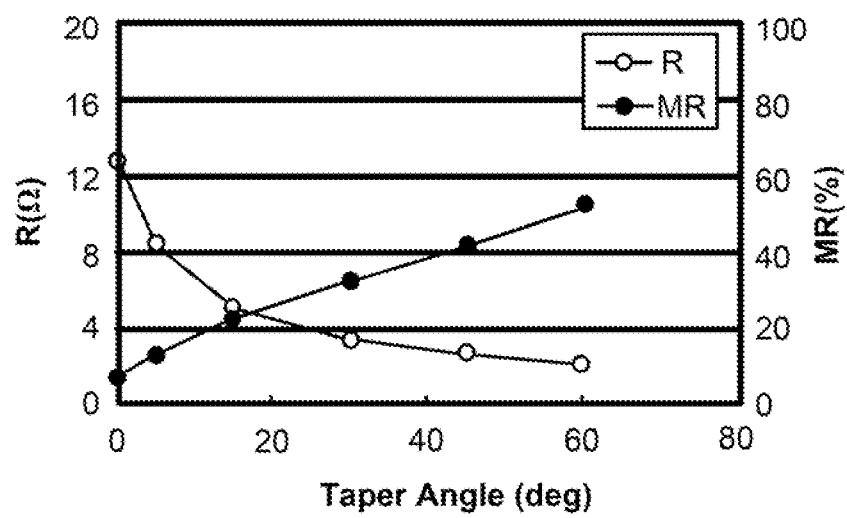
FIG. 9 is a graph showing a device resistance and an MR ratio in the case where the taper angle of the lateral side metal layer for the CPP-GMR film shown in FIG. 7.
Figure 10:
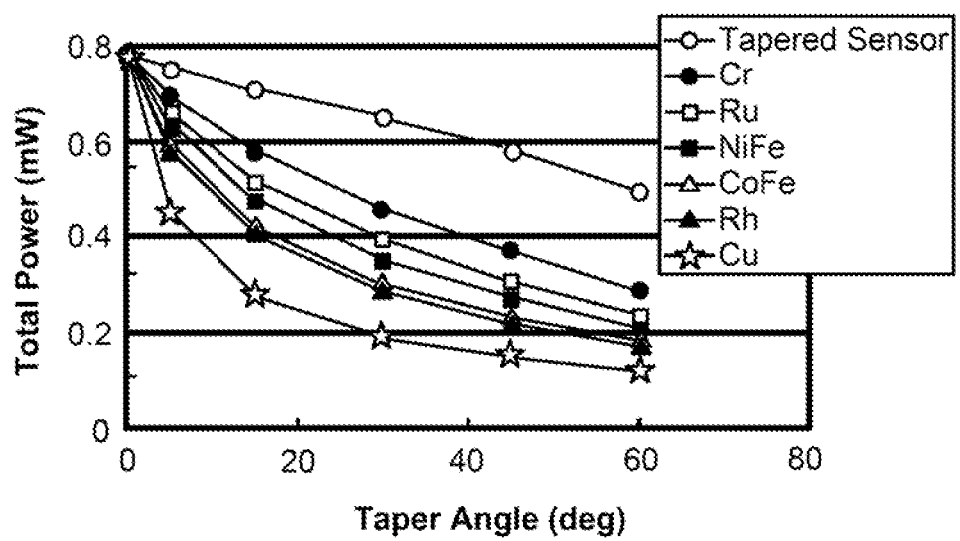
FIG. 10 is a graph showing Joule heat generation power of the entire CPP-GMR sensor film in a case of changing materials of the lateral side metal layer for the CPP-GMR film shown in FIG. 7 is changed.

FIG. 9 shows a device resistance R and an MR ratio of the CPP-GMR film when the taper angle of the lateral side metal layer 30 is changed and shows a similar trend to that in FIG. 5. Further, FIG. 10 shows the result of analysis of materials other than Cu as the material for the lateral side metal layer 30. For any of the materials, the effect is that the heat generation amount is suppressed compared with the case in which the magnetoresistive sensor film is provided in a tapered shape, and the order of the materials having higher effects is also identical with those of FIG. 6.

Next, specific examples of the invention are described with reference to the drawings.

EXAMPLE 1

Figure 11:
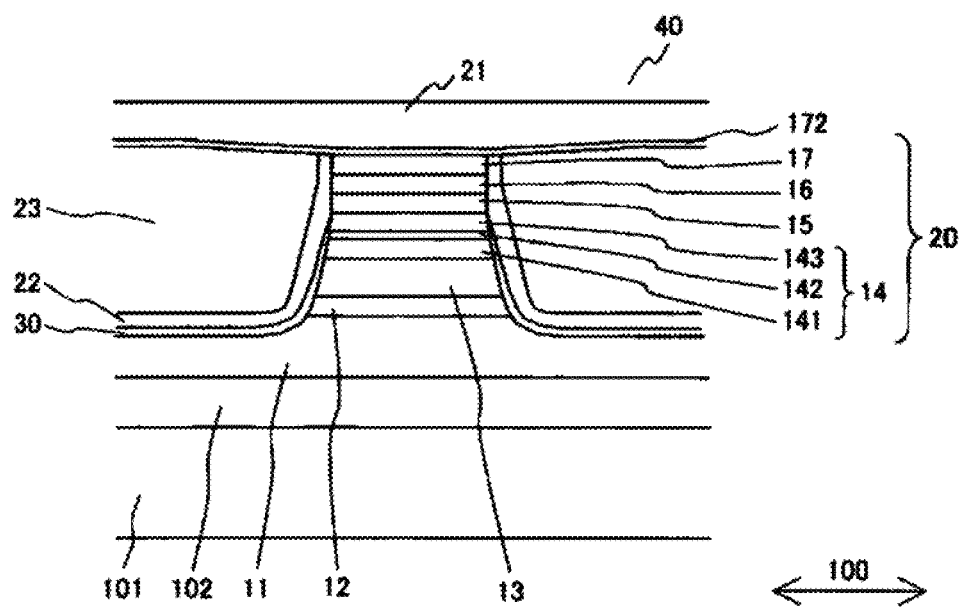
FIG. 11 is a schematic structural view in a track width direction of a CPP structure magnetoresistive head according to Example 1.

FIG. 11 shows a layer constitution of a portion of a magnetoresistive sensor film of a CPP stricture magnetoresistive head in a track width direction according to Example 1. An insulative film 102 such as formed of alumina may be covered over a substrate 101 comprising, for example, a sintered ceramic containing alumina and titanium carbide. That is to say, after planarizing the covered surface by fine polishing a lower shield layer (lower electrode layer) 11, for example, a Ni—Fe alloy is formed. After patterning a deposited film, for example, by a sputtering method, an ion beam sputtering method, a plating method, etc., into a predetermined shape, an insulative film, such as alumina, is formed over the entire surface of the substrate and planarized by a chemical mechanical polishing (CMP) method thereby making the height substantially identical with that of an insulative film disposed at the periphery thereof. In this case, the surface roughness of the lower shield layer 11 is further controlled to a predetermined level or less.

After cleaning a surface oxide layer in a film deposition apparatus, a seed layer 12, a pinning layer 13, a first ferromagnetic layer (pinned layer) 14, an intermediate layer 15, a second ferromagnetic layer (free layer) 16, and a cap layer 17 may be deposited in this order over the substrate. Cu, Ta, Ru, Rh, and Ni—Cr—Fe alloy or a stacked film of any of these materials may be used for the seed layer 12 and the cap layer 17. An antiferromagnetic layer, such as a Pt—Mn alloy, an Mn—Ir alloy, alloys thereof, etc., and a hard magnetic layer, such as a Co—Pt alloy, a Co—Cr—Pt alloy, alloys thereof, etc., can be used for the pinning layer 13. For the first ferromagnetic layer 14, a stacked film comprising a ferromagnetic layer on the side of the pinning layer 141, a spacer layer 142, and a ferromagnetic layer on the side of the intermediate layer 143 may be used. For the ferromagnetic layer on the side of the pinning layer 141, the ferromagnetic layer on the side of the intermediate layer 143, and the second ferromagnetic layer 16, an Ni—Fe alloy, a Co—Fe-alloy, a Co—Ni—Fe alloy, a material of high polarizability such as a magnetite or Huesler alloy, a stacked film thereof, etc., may be used. For the spacer layer 142, Ru, Rh, Ir, and a material comprising at least one of these materials may be used and the thickness may preferably be about 10 Å or less. When the CPP-GMR effect is utilized, the intermediate layer 15 is a conductive layer or a conductive layer having a current confining layer. Specifically, while Cu, Ag, Au or a mixture or a stacked body thereof may be used for the intermediate layer 15, a layer for confining current by partial oxidation or nitridation may be inserted. When the TMR effect is utilized, the intermediate layer 15 is a tunnel barrier layer and includes an oxide of Al, Mg, Si, Zr, Ti, a mixture thereof, or a stacked body of the oxides thereof. As described above, after depositing the magnetoresistive sensor film 20 including from the seed layer to the cap layer 17, an anneal in a magnetic field, or magnetization is applied in order to set the magnetization of the first ferromagnetic layer 14 to a predetermined direction. In particular, in the case where the pinning layer 13 comprises an antiferromagnetic material having an ordered lattice, for example, a Pt—Mn alloy or an Mn—Ir alloy, application of an anneal in a magnetic field is used until an ordered structure is formed and exchange coupling is generated between the pinning layer 13 and the first ferromagnetic layer 14.

Then, fabrication may be performed in the track width direction, according to one embodiment. A lift-off mask material may be formed in a region to form a sensor portion in a track width direction of the magnetoresistive sensor film 20, and the magnetoresistive sensor film, etc., at a portion are removed, possibly by etching. It is important, in this case, to not leave any re-deposition product on the side wall of the magnetoresistive sensor film 20 which is left. Then, a lateral side metal layer 30 may be formed such that the upper end thereof is in contact with the boundary between the ferromagnetic layer on the side of the intermediate layer 143 and the intermediate layer 15 by performing ion beam sputtering or sputtering through a direction control plate for sputtered particles or applying a bias potential to the side of the substrate, etc., thereby controlling the direction and the energy of particles to be deposited. For the lateral side metal layer 30, while a material having an electric resistivity lower than that of the material used for the pinning layer 13 can be used, Cu, Rh, a Co—Fe alloy, an Ni—Fe alloy, Ru, and Cr used for the magnetoresistive head are preferred materials with a view point that the material is preferably selected while considering the chemical stability in all of the processes where the magnetic head is formed. Further, a longitudinal biasing layer 23 of a thickness sufficient to generate a desired longitudinal bias magnetic field may be formed through an insulating layer 22 in the track width direction of a height substantially identical with that of the second ferromagnetic layer (free layer) 16 as a ferromagnetic layer in which the magnetization direction rotates in accordance with the external magnetic field of the magnetoresistive sensor film 20. Then, by removing the lift-off mask material, fabrication in the track width direction may be completed.

As the insulating layer 22 in the track width direction, a single-layered film, a mixed film, or a stacked film comprising, for example, alumina, silicon oxide, tantalum oxide, aluminum nitride, silicon nitride, tantalum nitride, and the like may be used. As the longitudinal biasing layer 23, a hard magnetic layer formed of such material as Co—Pt alloy or a Co—Cr—Pt alloy, a stacked film of a ferromagnetic layer formed of such material as an Ni—Fe alloy or a Co—Fe alloy and an antiferromagnetic layer formed of such material as a Pt—Mn alloy or an Mn—Ir alloy or a hard magnetic layer may be used. Also, an underlayer formed of such material as Cr may be disposed for controlling a property, particularly, the coercive force of the hard magnetic layer, and for suppressing damages during the process, a protective layer may be formed, for example, of Cr, a Cr—Mo alloy, a Cr—Ti alloy, an Ni—Fe alloy, Ta, Ru, and Rh.

After completing the fabrication in the track width direction, a lift-off mask material may be formed in a region to form a magnetoresistive sensor portion in a stripe height direction, according to one embodiment, and removal of the magnetoresistive sensor film, the insulating layer 22 in the track width direction and the longitudinal biasing layer 23, which are disposed in a region other than the region for the magnetoresistive sensor portion for detecting magnetic fields, is performed, possibly by etching. In this case, it is important not to leave re-deposition products at the end of the magnetic resistive sensor film 20 as is the case with the formation in the track width direction. Then, an insulative film in the stripe height direction, comprising a single-layered film, a mixed film, or a stacked film formed of such material as alumina, silicon oxide, tantalum oxide, aluminum nitride, silicon nitride, or tantalum nitride, may be deposited and the lift-off mask material may be removed to complete fabrication in the stripe height direction.

Then, leads are formed for supplying the sense current to the lower shield layer current to the lower shield layer (lower electrode layer) 11 and the upper shield layer (upper electrode layer) 21, according to one approach. As the material for the lead, a low resistive metal such as Cu, Au, Ta, Rh, and Mo may be used and other metal layers may also be disposed, optionally, on the lower side, the upper side, or both sides thereof.

Further, after optionally forming an insulative protective film, after cleaning of the top surface of the magnetoresistive sensor film 20 or the leads, an upper gap layer 172 that also serves as an underlayer for the upper shield layer 21 and the upper shield layer (upper electrode layer) 21 may be formed to complete the steps for the read element portion 40, in one embodiment.

In a case where the CPP structure magnetoresistive head acts as the read head, the wafer step may be completed at this stage, according to one approach. After that, an anneal may be performed while applying a magnetic filed in the track width direction of the read element portion 40 for setting the magnetization direction of the second ferromagnetic layer (free layer) 16 to the track width direction while keeping the direction of the magnetization in the first ferromagnetic layer (pinned layer) 14 substantially in the stripe height direction.

Figure 12:
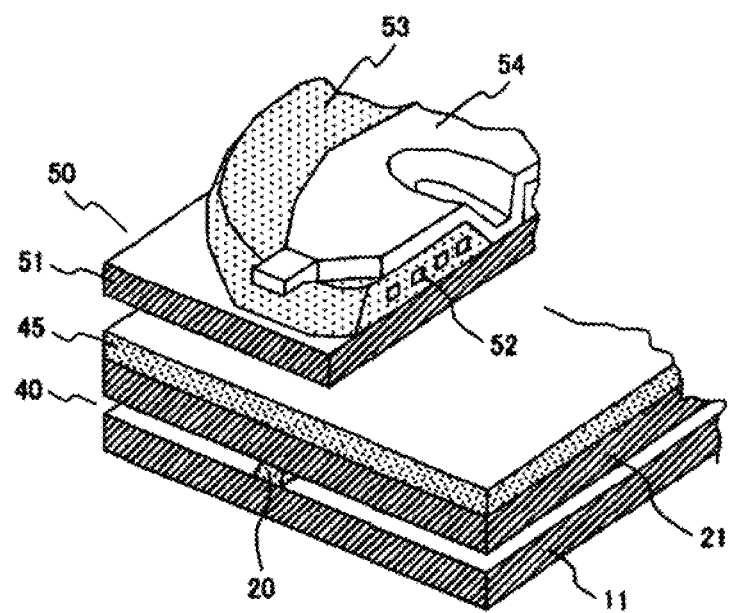
FIG. 12 is a perspective view showing the constitution having a write element in a CPP structure magnetoresistive head according to Example 1.

On the other hand, in a case where the CPP structure magnetoresistive head has a read element and a write element, a write element portion 50 may be formed above a read element portion 40 through a separation layer 45 for separating the read element portion and the write element portion to complete a wafer process, according to one approach, as shown in a perspective view of FIG. 12. The write element portion 50 is a perpendicular write head and has an auxiliary pole 51, a coil 52, a coil insulating layer 53, and a main pole 54. In this case, an anneal may be performed while applying a magnetic field in a track width direction of the read element portion 40 during or after fabrication of the write element portion 50, and an anneal may also be performed for setting the magnetization direction in the second ferromagnetic layer (free layer) 16 in a track width direction while keeping the magnetization direction of the first ferromagnetic layer (pinned layer) 14 substantially in a stripe height direction.

Successively, according to one embodiment, a head gimbal assembly may be completed through a lapping step of polishing a magnetic head device by mechanical polishing until it reaches a desired stripe height, a protective film forming step for protecting the read element (and write element) in a magnetic storage apparatus, a step of forming a predetermined rail shape in an air bearing surface for controlling a distance (flying height) between the magnetic head and the magnetic recording medium, and an assembling step of bonding individual magnetic heads to a suspension.

For comparison, a magnetic head of a conventional structure in which the lateral side metal layer 30 is not provided is also prepared, and evaluation of a temperature rise of the magnetic head when a sense current is adjusted so as to obtain an identical output and of a mean time to failure (MTTF) in a current load test at the sense current may be performed. The temperature rise of the magnetic head can be evaluated by disposing the magnetic head in an oven capable of changing the circumstantial temperature and obtaining a relation between an electric resistance value of the magnetic head at a low voltage (about 5 mV in one approach) under the different circumstantial temperature and an electric resistance value at the different applied voltage under a room temperature. Further, MTTF in the current load test may be given by the following Equation (3).

$$1/MTTF = A_0 \times \exp(-E_a/k_B T) \qquad (3)$$

In the formula (3), $E_a$ represents an activation energy in the deterioration phenomenon due to current load, $k_B$ represents a Boltzman constant, T represents a magnetic head temperature, and $A_0$ represents a constant. The magnetic head temperature T is a value of a circumstantial temperature with addition of a temperature rise due to the sense current. In one experiment, current is supplied continuously to the magnetic head with the sense current maintained constant and with the different circumstantial temperature and then a current load time when the performances are out of desired values is determined. In the evaluation of the magnetic head, appropriate resistance value ranges from about 95% to about 105% of the initial value and appropriate output value ranges from about 90% to about 110% of the initial value, and whichever goes out of the appropriate range earlier is defined as the time to failure. 240 magnetic heads according to Example 1 and 240 heads of the conventional structure were used for measurement.

The temperature rise during supply of the sense current is about 110° C. by using the head of the conventional structure, whereas it is at 35° C. by using the magnetic head of Example 1, and the advantage of suppressing the heat generation and the advantage of improving the heat dissipation were developed remarkably by the provision of the lateral side metal layer 30. Further, while the activation energy obtained by the current load test was about 2.0 eV in both cases using the head of the conventional structure and using the head of Example 1, when MTTF at a circumstantial temperature of 60° C. is calculated, there is a large difference between 2.4 h for the conventional head and $1.16 \times 10^5$ h for the head of Example 1. Consequently, improvement of the current load reliability due to the lateral side metal layer 30 can be confirmed.

As has been described above, the CPP structure magnetoresistive head of Example 1 is excellent in long time reliability such as current load lifetime, since heat generation of the magnetoresistive sensor film is suppressed and the heat dissipation efficiency is improved without deteriorating the exchange coupling properties between the pinning layer and the pinned ferromagnetic layer. On the other hand, since the head resistance of the read head lowers, resistive noises can be suppressed and, further, since the output increases in the constant voltage driving, a high signal-to-noise ratio (SNR) can also be attained.

EXAMPLE 2

In Example 1 described above, to obtain a maximum advantage of the suppression of heat generation and heat dissipation, the lateral side metal layer 30 is been formed such that its upper end is in contact with the boundary between the ferromagnetic layer on the side of the intermediate layer 143 and the intermediate layer 15. However, since the output would be lowered if the lateral side metal layer 30 reached as far as the side wall of the intermediate layer 15 or the side wall of the second ferromagnetic layer 16, optimization may make the process of forming the lateral side metal layer 30 at high accuracy obtain a higher yield.

Figure 13:
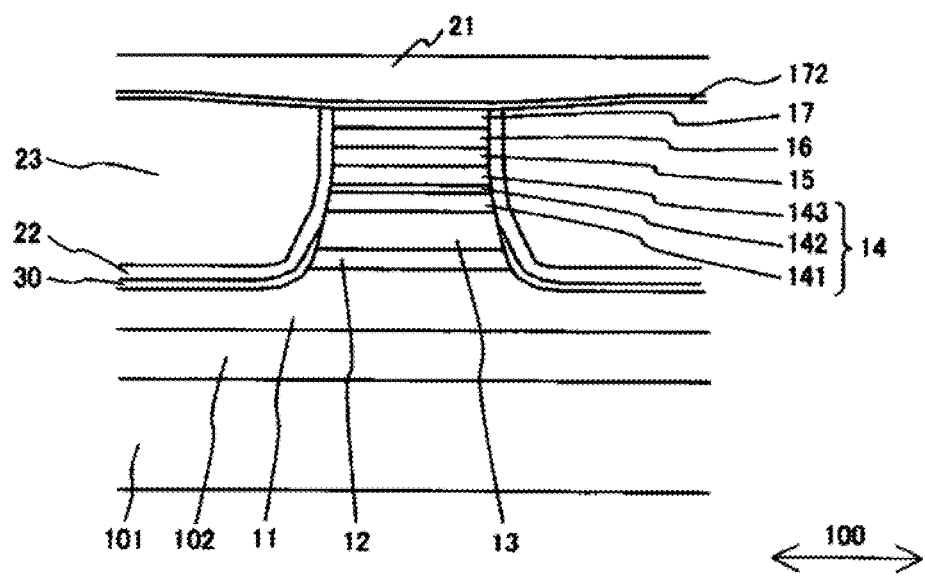
FIG. 13 is a schematic structural view in a track width direction of a CPP structure magnetoresistive head according to Example 2.

Margin for the fabrication process can be extended by lowering the position of the upper end of the lateral side metal layer 30 to the first ferromagnetic layer 14 or to the lower shield layer side of the pinning layer 13. As an example, FIG. 13 shows a layer constitution in a track width direction of the portion of the magnetoresistive sensor film according to Example 2. In this example, the upper end of the lateral side metal layer 30 is adjusted to a position at a one-half height of the film thickness of the pinning layer 13.

As a result of evaluation of the fabricated magnetic head performed in the same manner as in Example 1, temperature rise during supply of the sense current was 48° C. and MTTF at a circumstantial temperature of 60° C. was $1.31 \times 10^4$ h. While the temperature rise was greater and MTTF was shortened by one digit compared with those of the head according to Example 1, temperature rise was suppressed by about 60° C. and MTTF was made longer by three digits compared with those of the conventional head.

EXAMPLE 3

Figure 14:
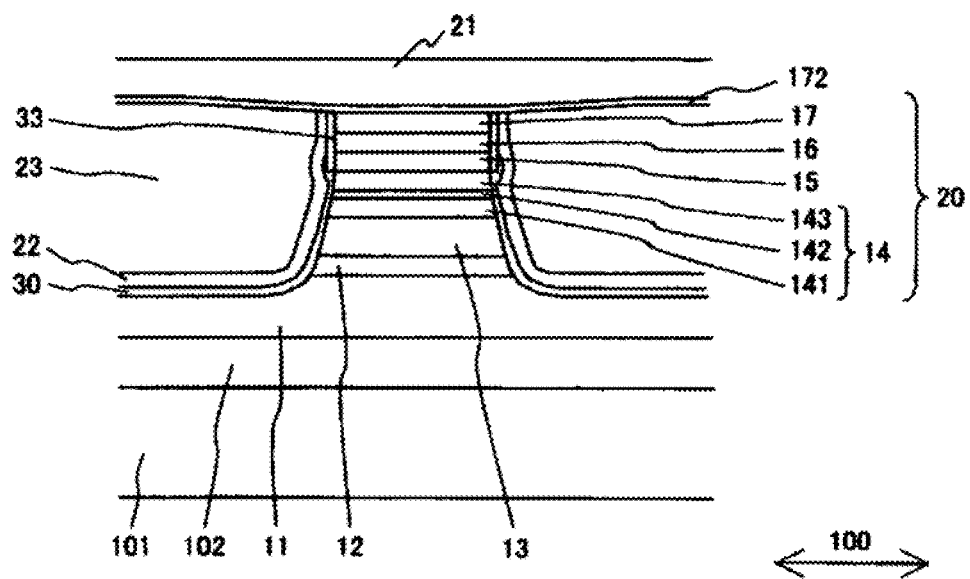
FIG. 14 is a schematic structural view in a track width direction of a CPP structure magnetoresistive head according to Example 3.

To make the maximum advantage of suppressing the heat generation and the heat dissipation compatible with a high yield, a CPP structure magnetoresistive head shown in FIG. 14 is fabricated according to Example 3. FIG. 14 shows the layer structure of the magnetoresistive sensor film portion in a track width direction. In the magnetic head of this example, the process is conducted in the same manner as in Example 1 until the fabrication of the magnetoresistive sensor film 20 is completed and then fabrication in the track width direction is performed as described below. After forming a lift-off mask material in a region to form the sensor portion of the magnetoresistive sensor film 20 in the track width direction and etching the portion of the cap layer 17, the second ferromagnetic layer 16, and as far as the intermediate layer 15, the portion not being masked, an insulative material 33 is formed by an oxidation or nitridation treatment, or deposition of an oxide or nitride film, on the side wall fabricated by etching. Successively, after etching a first ferromagnetic layer 14, a pinning layer 13, a seed layer 12, etc., and forming a lateral side metal layer 30, an insulating layer 22 in the track width direction, a longitudinal biasing layer 23, etc., the lift-off mask material is removed. Subsequent steps after fabrication in a stripe height direction is identical with those described in Example 1. With such a head structure, while the process step was made lengthy, degradation of the yield due to lowering of the read output was eliminated. That is, the maximum advantage of the suppression of heat generation and heat dissipation can be made compatible with the high yield.

EXAMPLE 4

Figure 15:
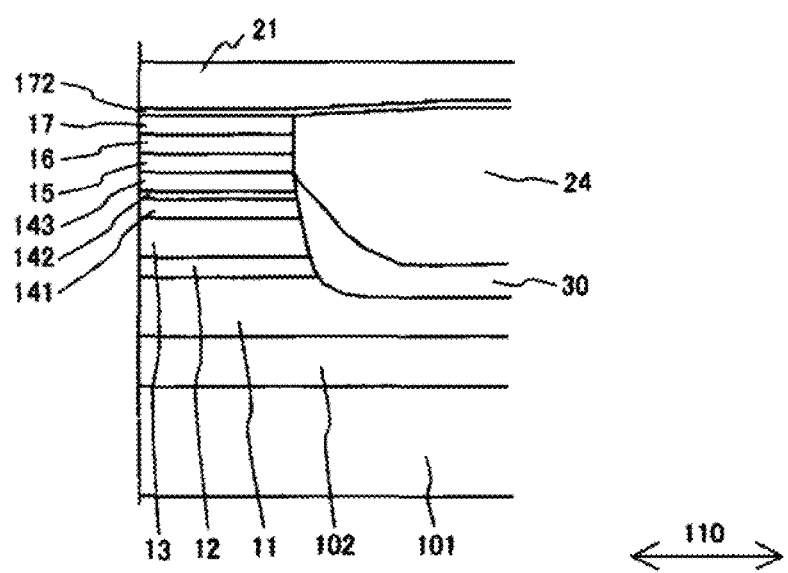
FIG. 15 is a schematic structural view in a stripe height direction of a CPP structure magnetoresistive head according to Example 4.

The lateral side metal layer 30 can be disposed not only in the track width direction but also in the stripe height direction. FIG. 15 is a view showing the layer constitution of the magnetoresistive sensor film portion in the stripe height direction according to Example 4 in which a lateral side metal layer 30 is disposed also in the stripe height direction.

Upon fabrication in the stripe height direction, after forming a lift-off mask material in a region to form a magnetoresistive sensor portion in the stripe height direction and removing a magnetoresistive sensor film, an insulating layer 22 in the track width direction, and a longitudinal biasing layer 23, etc., which are disposed in a region other than the region for the magnetoresistive sensor portion for detecting magnetic fields, a lateral side metal layer 30 is formed such that its upper end is in contact with the boundary between the ferromagnetic layer on the side of the intermediate layer 143 and the intermediate layer 15 and further, an insulative film in the stripe height direction 24 is formed to fabricate the structure shown in FIG. 15.

In the approach where the lateral side metal layer 30 is disposed in the track width direction, selecting of the thickness and the taper angle thereof may be performed while ensuring that a longitudinal bias magnetic field applied from the longitudinal biasing layer to the second ferromagnetic layer 16 is at a desired level. In the case of the stripe height direction, the thickness and the tape angle of the lateral side metal layer 30 can be selected relatively optionally unless the thickness of the insulative film in the stripe height direction 24 is reduced to increase the electrostatic capacitance and restrict the transfer rate.

Figure 16:
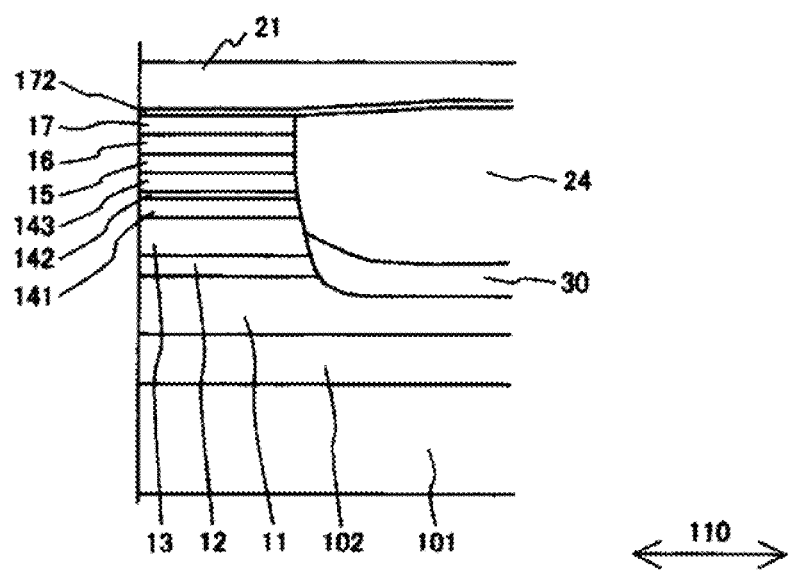
FIG. 16 is a schematic structural view in a stripe height direction of a CPP structure magnetoresistive head according to a modified example of Example 4.
Figure 17:
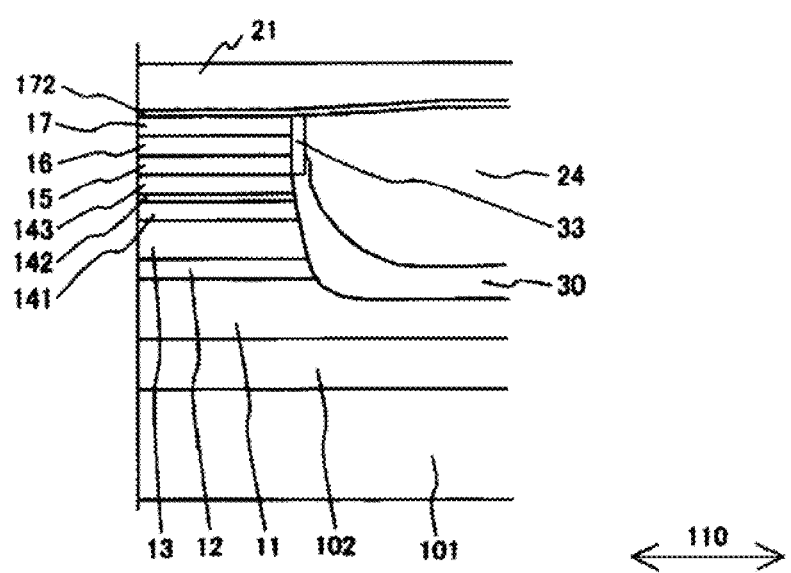
FIG. 17 is a schematic structural view in a stripe height direction of a CPP structure magnetoresistive head according to another modified example of Example 4.

With an aim of improving the yield without lengthening the step, the upper end of the lateral side metal layer 30 may be lowered to the side of the lower shield layer 11 side such that it is in contact at least with a portion of the side wall of the pinning layer 13 also in the stripe height direction as in the track width direction as shown in FIG. 16. Further, as shown in FIG. 17, to make the maximum advantage of suppressing the heat generation and the heat dissipation compatible with the high yield, the lateral side metal layer 30 may be disposed after disposing a lateral side insulative film 33.

EXAMPLE 5

The lateral side metal layer 30 has been disposed on the wall in the track width direction of the magnetoresistive sensor film 20 in Examples 1-3 and disposed on the wall in the track width direction and on the wall in the stripe height direction of the magnetoresistive sensor film 20 as shown in FIG. 15 (Example 5). According to Example 5, the same advantage as that in Example 1 is obtained. Further, as explained for Example 4, since the lateral side metal layer 30 is formed on the wall in the stripe height direction, it has an advantage capable of selecting the thickness and taper angle of the lateral side metal layer 30 relatively optionally unless the thickness of the insulative film in the stripe height direction 24 is reduced to increase the static capacitance and restrict the transfer rate.

Description has been made of Examples 1-5. In Examples 1-5, a CPP-GMR film in which the intermediate layer 15 is the conductive layer or the conductive layer having the current confining layer, and a TMR film in which it is the barrier layer is described as the magnetoresistive sensor film 20 in Examples 1-5. However, the advantage of the invention is not different in other devices in which the sense current flows so as to pass through the film plane of the material constituting the magnetoresistive sensor film, and the electric resistivity of the pinning layer 13 is higher compared with that of other layers, for example, other devices using a magnetic semiconductor or utilizing the diffusion or accumulation effect of polarized spin. Further, although the first ferromagnetic layer 14 and the second ferromagnetic layer 16 are different constitution in stacked structure each other, they show specific examples and are not always restrictive. The seed layer 12, the cap layer 17, and the upper gap layer 172 are not essential but may not be disposed when they are not necessary in view of the structure or manufacturing steps.

For the manufacturing method, while a manufacturing method of performing primary fabrication in the track width direction has been explained as an example, the advantage of the invention is unchanged also by other manufacturing methods of performing primary fabrication in the stripe height direction.

Further, while descriptions have been made of a magnetoresistive heads in which the magnetoresistive sensor film is disposed so as to be exposed to the air bearing surface, the same advantage can be obtained also by a magnetoresistive head in which the magnetoresistive sensor film is disposed being apart from the air bearing surface and is not exposed at all or exposed only partially to the air bearing surface.

The following list is a description of the reference numerals and signs, and is provided for quick reference to the references consistent throughout the various figures included herein:
- 11: Lower shield layer (lower electrode layer)
- 12: Seed layer
- 13: Pinning layer
- 14: First ferromagnetic layer
- 141: Ferromagnetic layer on the side of the pinning layer
- 142: Spacer layer
- 143: Ferromagnetic layer on the side of an intermediate layer
- 15: Intermediate layer
- 17: Cap layer
- 20: Magnetoresistive sensor film
- 21: Upper shield layer (Upper electrode layer)
- 22: Insulating layer in a track width direction
- 23: Longitudinal biasing layer
- 24: Protective film in a stripe height direction
- 30: Lateral side metal layer
- 31: Taper angle
- 33: Lateral side insulative film
- 40: Read element portion
- 100: Track width direction
- 101: Substrate
- 102: Insulative film
- 110: Stripe height direction
- 172: Upper gap layer

What is claimed is:

1. A magnetoresistive head comprising:
a magnetoresistive sensor film positioned between a lower shield layer and an upper shield layer, the magnetoresistive sensor film comprising a stack of at least: a pinning layer, a first ferromagnetic layer positioned above the pinning layer, an intermediate layer positioned above the first ferromagnetic layer, and a second ferromagnetic layer positioned above the intermediate layer; and
a lateral side metal layer being electrically conductive and having an electric resistivity lower than an electric resistivity of the pinning layer positioned on a side wall of one or more layers of the magnetoresistive sensor film,
wherein the lateral side metal layer is positioned on a side wall of the pinning layer and is in contact with the lower shield layer,
wherein a sense current flows so as to pass through an interface between the intermediate layer and the second ferromagnetic layer, and
wherein a resistance change of the magnetoresistive sensor film is detected in accordance with a change of an external magnetic field.

2. The magnetoresistive head according to claim 1, wherein the lateral side metal layer is disposed on a side wall of the magnetoresistive sensor film in both a track width direction and a stripe height direction.

3. The magnetoresistive head according to claim 1, wherein the pinning layer is an antiferromagnetic layer or a hard magnetic layer.

4. The magnetoresistive head according to claim 3, wherein the antiferromagnetic layer is a Mn—Ir alloy layer or a Pt—Mn alloy layer.

5. The magnetoresistive head according to claim 3, wherein the hard magnetic layer is a Co—Pt alloy layer or a Co—Cr—Pt alloy layer.

6. The magnetoresistive head according to claim 1, wherein the lateral side metal layer is in contact with the side wall of the pinning layer but not in contact with a side wall of the intermediate layer.

7. The magnetoresistive head according to claim 1, wherein the lateral side metal layer is in contact with the side wall of the pinning layer but not in contact with a side wall of the intermediate layer and a side wall of the first ferromagnetic layer.

8. The magnetoresistive head according to claim 1, wherein the lateral side metal layer comprises a material selected from a group consisting of: Cu, Rh, Co—Fe alloy, Ni—Fe alloy, Ru, Cr, and an alloy thereof.

9. The magnetoresistive head according to claim 1, wherein the intermediate layer comprises a conductive material, a mixture of a conductive material and a high resistance material, or a mixture of a conductive material and an insulative material.

10. The magnetoresistive head according to claim 1, further comprising an insulating layer positioned on a side wall of the intermediate layer and a side wall of the second ferromagnetic layer.

11. The magnetoresistive head according to claim 1, further comprising a longitudinal biasing layer through an insulating layer positioned on both sides of the magnetoresistive sensor film in a track width direction.

12. The magnetoresistive head according to claim 11, wherein the longitudinal biasing layer is a hard magnetic layer, a stacked film of a ferromagnetic layer and an antiferromagnetic layer, or a stacked film of a ferromagnetic layer and a hard magnetic layer.

13. The magnetoresistive head according to claim 1, further comprising an inductive write head disposed through a separation layer above the upper shield layer.

14. A magnetoresistive head comprising:
a magnetoresistive sensor film positioned between a lower shield layer and an upper shield layer, the magnetoresistive sensor film comprising a stack of at least: a pinning layer, a first ferromagnetic layer positioned above the pinning layer, an intermediate layer positioned above the first ferromagnetic layer, and a second ferromagnetic layer positioned above the intermediate layer; and
a lateral side metal layer being electrically conductive and having an electric resistivity lower than an electric resistivity of the pinning layer positioned on a side wall of one or more layers of the magnetoresistive sensor film in a track width direction,
wherein the lateral side metal layer is positioned on a side wall of the pinning layer and is in contact with the lower shield layer,
wherein a sense current flows so as to pass through an interface between the intermediate layer and the second ferromagnetic layer, and
wherein a resistance change of the magnetoresistive sensor film is detected in accordance with a change of an external magnetic field.

15. The magnetoresistive head according to claim 14, wherein the pinning layer is an antiferromagnetic layer or a hard magnetic layer.

16. The magnetoresistive head according to claim 14, wherein the lateral side metal layer is in contact with the side wall of the pinning layer but not in contact with a side wall of the intermediate layer.

17. The magnetoresistive head according to claim 14, wherein the lateral side metal layer comprises a material selected from a group consisting of: Cu, Rh, Co—Fe alloy, Ni—Fe alloy, Ru, Cr, and an alloy thereof.

18. The magnetoresistive head according to claim 14, further comprising an insulating layer positioned on a side wall of the intermediate layer and a side wall of the second ferromagnetic layer.

19. The magnetoresistive head according to claim 14, further comprising an inductive write head disposed above the upper shield layer through a separation layer.

20. A magnetoresistive head comprising:
a magnetoresistive sensor film positioned between a lower shield layer and an upper shield layer, the magnetoresistive sensor film comprising a stack of at least: a pinning layer, a first ferromagnetic layer positioned above the pinning layer, an intermediate layer positioned above the first ferromagnetic layer, and a second ferromagnetic layer positioned above the intermediate layer; and
a lateral side metal layer being electrically conductive and having an electric resistivity lower than an electric resistivity of the pinning layer positioned on a side wall of one or more layers of the magnetoresistive sensor film in a stripe height direction,
wherein the lateral side metal layer is positioned on a side wall of the pinning layer and is in contact with the lower shield layer,
wherein a sense current flows so as to pass through an interface between the intermediate layer and the second ferromagnetic layer, and
wherein a resistance change of the magnetoresistive sensor film generated by a change of an external magnetic field is detected.

* * * * *

UNITED STATES PATENT AND TRADEMARK OFFICE
CERTIFICATE OF CORRECTION

PATENT NO. : 8,537,503 B2  
APPLICATION NO. : 12/547394  
DATED : September 17, 2013  
INVENTOR(S) : Watanabe et al.

Page 1 of 1

It is certified that error appears in the above-identified patent and that said Letters Patent is hereby corrected as shown below:

In the specification:

col. 6, line 12, replace "100 in V" with --100 mV--;

col. 8, line 2, replace "CPP-CMR" with --CPP-GMR--;

col. 8, line 54, replace "Wiedemann-Franz's" with --Wiedernann-Franz's--;

col. 9, line 67, replace "stricture" with --structure--;

col. 12, line 57, replace formula (3) with: $1/MTTF = A_0 \times \exp(-E_a/k_B T)$ (3).

Signed and Sealed this  
Third Day of December, 2013

Margaret A. Focarino  
*Commissioner for Patents of the United States Patent and Trademark Office*